US010519985B2

(12) United States Patent
Jaffrey

(10) Patent No.: US 10,519,985 B2
(45) Date of Patent: Dec. 31, 2019

(54) HYBRID PRESSURE AND THERMAL EXCHANGER

(71) Applicant: Breakthrough Technologies, LLC, Boston, MA (US)

(72) Inventor: Kamal Jaffrey, Winchester, MA (US)

(73) Assignee: Breakthrough Technologies, LLC, Boston, MA (US)

(*) Notice: Subject to any disclaimer, the term of this patent is extended or adjusted under 35 U.S.C. 154(b) by 251 days.

(21) Appl. No.: 15/532,704

(22) PCT Filed: Dec. 4, 2015

(86) PCT No.: PCT/US2015/063924
§ 371 (c)(1),
(2) Date: Jun. 2, 2017

(87) PCT Pub. No.: WO2016/090216
PCT Pub. Date: Jun. 9, 2016

(65) Prior Publication Data
US 2017/0356470 A1    Dec. 14, 2017

Related U.S. Application Data

(60) Provisional application No. 62/160,025, filed on May 12, 2015, provisional application No. 62/087,298, filed on Dec. 4, 2014.

(51) Int. Cl.
| F04F 13/00 | (2009.01) |
| F01D 5/02 | (2006.01) |
| F01D 15/10 | (2006.01) |
| H01L 35/04 | (2006.01) |

(Continued)

(52) U.S. Cl.
CPC .............. *F04F 13/00* (2013.01); *B01D 61/06* (2013.01); *F01D 5/02* (2013.01); *F01D 15/10* (2013.01);

(Continued)

(58) Field of Classification Search
CPC .......... B01D 61/06; F01D 5/02; F01D 15/10; H01L 35/04; H01L 35/12; H01L 35/30; H02K 7/1823; F05D 2240/60; F04F 13/00

(Continued)

(56) References Cited

U.S. PATENT DOCUMENTS 5,959,240 A * 9/1999 Yoshida .................. H01L 35/30
136/203
7,021,063 B2   4/2006 Viteri
(Continued)

FOREIGN PATENT DOCUMENTS

| GB | 2405448 A | 3/2005 |
| GB | 2411766 A | 9/2005 |

(Continued)

OTHER PUBLICATIONS

Supplementary Partial European Search Report corresponding to European Patent Application No. 15866328.6, dated Sep. 28, 2018, 10 pages.

*Primary Examiner* — Charles Reid, Jr.
(74) *Attorney, Agent, or Firm* — Mintz Levin Cohn Ferris Glovsky and Popeo, P.C.

(57) ABSTRACT

A system exchanges pressure and heat from a source stream to a sink stream. The system includes a source exchanger and a sink exchanger. The source exchanger includes a first pressure exchanger and a first heat exchanger. The first pressure exchanger converts pressure of the source stream to electrical energy. The first heat exchanger converts temperature from the source stream via a first temperature differential to electrical energy. The sink exchanger includes a second pressure exchanger and a second heat exchanger. The second pressure exchanger uses electrical energy received from the source exchanger to change a pressure of the sink stream. The second heat exchanger uses electrical energy received from the source exchanger to change a temperature (Continued)

of the sink stream. Related apparatus, systems, techniques, and articles are also described.

11 Claims, 14 Drawing Sheets

(51) Int. Cl.
    *H01L 35/12*     (2006.01)
    *H02K 7/18*     (2006.01)
    *H01L 35/30*     (2006.01)
    *B01D 61/06*     (2006.01)

(52) U.S. Cl.
    CPC .............. *H01L 35/04* (2013.01); *H01L 35/12* (2013.01); *H01L 35/30* (2013.01); *H02K 7/1823* (2013.01); *F05D 2240/60* (2013.01)

(58) Field of Classification Search
    USPC ........................ 290/1 A, 2, 52; 136/200, 205
    See application file for complete search history.

(56) References Cited

U.S. PATENT DOCUMENTS

| | | |
|---|---|---|
| 2004/0045594 A1 | 3/2004 | Hightower |
| 2006/0245909 A1 | 11/2006 | Stover |
| 2013/0048045 A1* | 2/2013 | Bayer ................... C22B 1/00 |
| | | 136/201 |
| 2013/0168964 A1 | 7/2013 | Xu et al. |
| 2013/0213449 A1 | 8/2013 | Parish et al. |
| 2014/0202144 A1 | 7/2014 | Al-Hawaj |
| 2015/0144172 A1* | 5/2015 | Erbil ...................... H01L 37/02 |
| | | 136/211 |

FOREIGN PATENT DOCUMENTS

| | | |
|---|---|---|
| WO | WO-2010088919 A1 | 8/2010 |
| WO | 2012/136243 A1 | 10/2012 |

\* cited by examiner

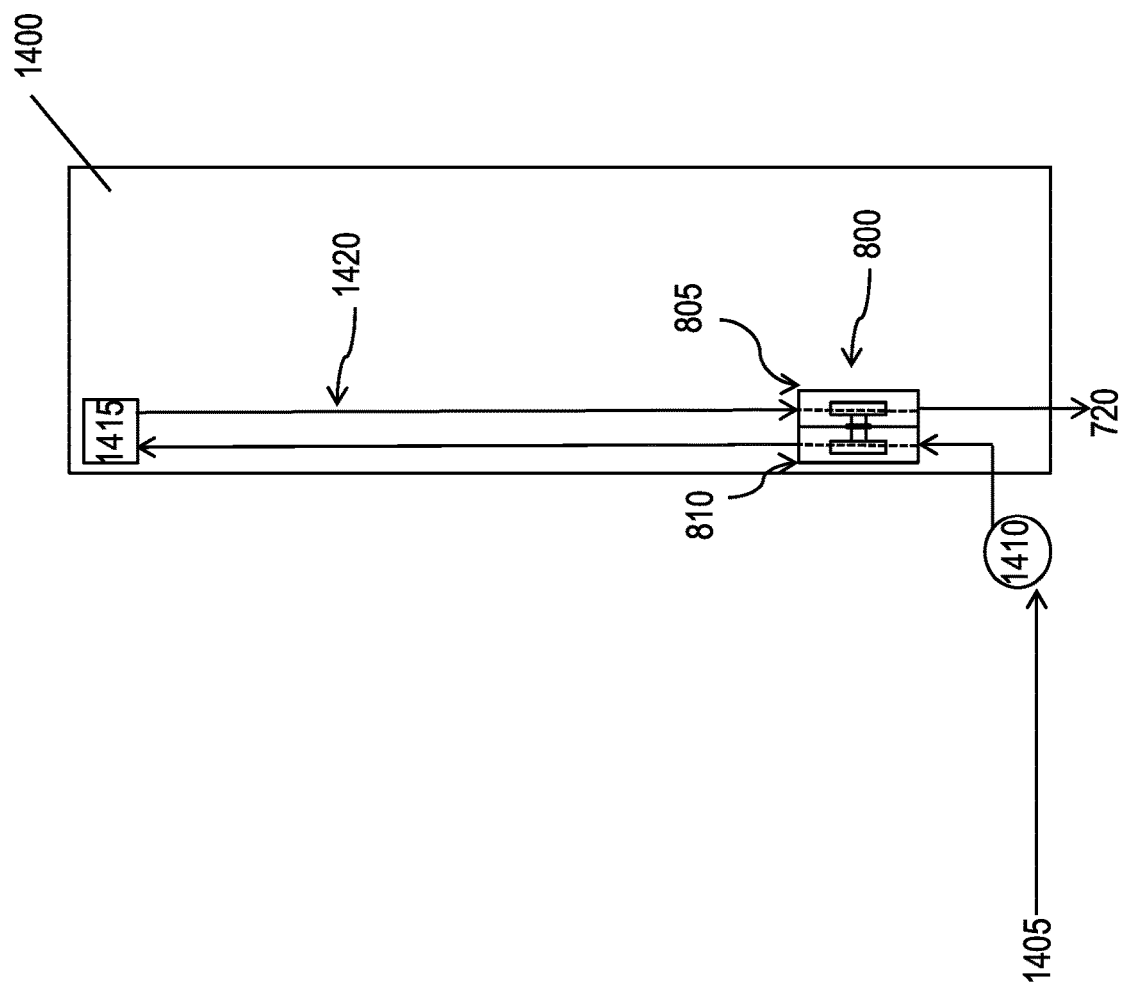

HYBRID PRESSURE AND THERMAL EXCHANGER

RELATED APPLICATIONS

This application is a national stage application filed under 35 U.S.C. § 371, of International Patent Application No. PCT/US2015/063924, filed Dec. 4, 2015, which claims priority under 35 U.S.C. § 119(e) to U.S. Patent Application No. 62/087,298 filed Dec. 4, 2014, and claims priority to U.S. Patent Application No. 62/160,025, filed May 12, 2015, the entire contents of each of which is hereby expressly incorporated by reference herein.

TECHNICAL FIELD

The subject matter described herein relates to an exchanger for recovering energy in the form of one or more of pressure energy, electrical energy, and/or thermal energy.

BACKGROUND

Many industrial processes operate at elevated pressures and temperatures. These industrial processes often produce high-pressure and/or high-temperature waste streams. These industrial processes often require significant energy, both in terms of increasing input stream pressure and temperature, which is both costly and inefficient. The high-pressure and/or high-temperature waste streams represent significant under-utilized potential energy. One example process that operates at elevated pressures and temperatures is desalination, which can utilize reverse osmosis under high pressure and/or utilize high temperatures to create potable water.

SUMMARY

In an aspect, a system exchanges pressure and heat from a source stream to a sink stream. The system includes a source exchanger and a sink exchanger. The source exchanger includes a first pressure exchanger and a first heat exchanger. The first pressure exchanger converts pressure of the source stream to electrical energy. The first heat exchanger converts temperature from the source stream via a first temperature differential to electrical energy. The sink exchanger includes a second pressure exchanger and a second heat exchanger. The second pressure exchanger uses electrical energy received from the source exchanger to change a pressure of the sink stream. The second heat exchanger uses electrical energy received from the source exchanger to change a temperature of the sink stream.

One or more of the following aspects can be included in any feasible combination. For example, the source exchanger can include a source junction box combining electrical energy received from the first pressure exchanger with electrical energy received from the first heat exchanger. The sink exchanger can include a sink junction box distributing a portion of electrical energy to the second pressure exchanger and distributing another portion of electrical energy to the second heat exchanger.

The first heat exchanger and/or the second heat exchanger can include a plurality of thermoelectric plates. Each thermoelectric plate can include a thermoelectric layer, gasket layers adjacent at least two sides of the thermoelectric layer, heat transfer layers adjacent the gasket layers such that the gasket layers separate the heat transfer layers from the thermoelectric layer, and one or more junction layers in contact with the thermoelectric layer. The thermoelectric layer and the one or more junction layers can be formed of a n-type and/or p-type material. The plurality of thermoelectric plates can be arranged in a box configuration. The plurality of thermoelectric plates can be arranged within a pipe and along an axial flow axis of the pipe. The source exchanger and sink exchanger can be non-proximal.

The subject matter described herein provides many technical advantages. For example, energy can be recovered and recycled in many processes and environments. The exchanger can be constructed simply, avoiding complex mechanical systems that require constant maintenance and upkeep. One-to-one exchange, one-to-many exchange, many-to-one exchange, and many-to-many exchange can be possible, allowing for recovery and/or recycling of energy in both pressure and thermal form. By recycling power, energy costs are reduced. Electrical heat and pressure transfer can be accomplished. Piping requirements can be reduced. The transfer of energy can be performed even while the source (e.g., a waste stream) and sink (e.g., an input stream) are non-proximal. Such non-proximal arrangements can enable energy transfer between hazardous environments or streams and clean environments or streams.

Further technical advantages may be achieved in some implementations. For example, fouling of components (e.g., heat transfer plates) may be limited, reduced, and/or eliminated through removable and/or self-cleaning elements. Vibrations, which may be common in some pressure and heat exchangers, can be reduced and/or eliminated. The current subject matter can be implemented in small and/or scalable units and without moving parts. Implementations can include cheaper and more efficient systems through inexpensive materials, manufacturing methods, and simple construction. According to aspects of the current subject matter, streams with extreme temperatures and/or pressures can be considered as a resource. The current subject matter can be non-specific to or independent of flow materials. Some implementations allow for low weight exchangers.

In another aspect, an exchanger includes a seal, a first channel, a second channel, and a transfer turbine. The first channel includes an inlet and an outlet. The second channel is alongside the first channel, is isolated from the first channel by the seal, and the second channel includes an inlet and an outlet. The transfer turbine includes a first portion, a second portion, and a shaft. The first portion includes one or more blades located within the first channel. The second portion includes one or more blades located within the second channel. The shaft connects the first portion and the second portion such that rotation of the first portion is synchronized with rotation of the second portion. The shaft extends through the seal.

In another aspect, an energy recycling system includes a pump and an exchanger. The pump increases pressure of an input stream to generate a high-pressure stream for use within a process. The process generates a waste stream having a pressure. The exchanger receives the waste stream, receives at least a portion of the input stream, and converts some of the waste stream pressure to the input stream to generate the high-pressure stream. The pressure exchanger includes a seal, a first channel, a second channel, and a transfer turbine. The first channel includes an inlet receiving the waste stream and an outlet for the waste stream to exit the first channel. The second channel is alongside the first channel and isolated from the first channel by the seal. The second channel includes an inlet receiving the input stream and an outlet for the high-pressure stream to exit the second channel. The transfer turbine includes a first portion, a second portion, and a shaft. The first portion includes one or more blades located within the first channel. The second portion includes one or more blades located within the second channel. The shaft connects the first portion and the second portion such that rotation of the first portion is synchronized with rotation of the second portion. The shaft extends through the seal.

One or more of the following features can be included in any feasible combination. For example, an electrical generator stator can be included adjacent the shaft of the transfer turbine. The shaft of the transfer turbine can include a rotor, which, when rotated by stream flow in the first channel, induces electrical current. Force exerted on the blades of the first portion of the transfer turbine by a high-pressure stream can cause rotation of the blades of the second portion of the transfer turbine, which can transfer pressure from the high-pressure stream to a low-pressure stream in the second channel.

A third channel can be adjacent the second channel and can include an inlet and an outlet, with a second seal between the second channel and the third channel isolating the second channel and the third channel. The shaft can extend through the second channel and the second seal into the third channel. The shaft can include a third portion including blades and residing within the third channel such that rotation of the first portion is synchronized with rotation of the second portion and the third portion. Force exerted on the blades of the first portion of the transfer turbine by a high-pressure stream entering the first channel inlet and exiting the first channel outlet causes rotation of the blades of the second portion of the transfer turbine, which transfers pressure from the high-pressure stream to a first low-pressure stream entering the second channel inlet and exiting the second channel outlet, and also transfers pressure from the high-pressure stream to a second low-pressure stream entering the third channel inlet and exiting the third channel outlet.

The first channel can include a first pipe and the second channel can include a second pipe. The high-pressure stream can have a pressure that is greater than a pressure of the low-pressure stream. The exchanger can receive at least a portion of the input stream in parallel with the pump. The exchanger can receive at least a portion of the input stream in series with the pump.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

FIG. 14 is a system block diagram illustrating an exchanger operating to recycle energy in an office building.

Like reference symbols in the various drawings indicate like elements.

DETAILED DESCRIPTION

The current subject matter can include an exchanger for transferring or exchanging energy from a high-temperature and pressurized stream to another lower temperature and lower pressure stream. The energy transferred can be either thermal, mechanical (in the form of pressure), or both (e.g., a hybrid exchange). In some implementations, exchange is indirect, for example, pressure and heat from a source can be converted (using, for example, turbines/generators and thermoelectric generators) into electrical energy, which can be distributed to a sink to change the sink's pressure and heat (using, for example, the electrical energy to drive pumps/motors and thermoelectric generators). The current subject matter can be compact, inexpensive, and can be applied to recycle energy in many applications involving high-temperature and pressurized fluid streams.

Figure 1:
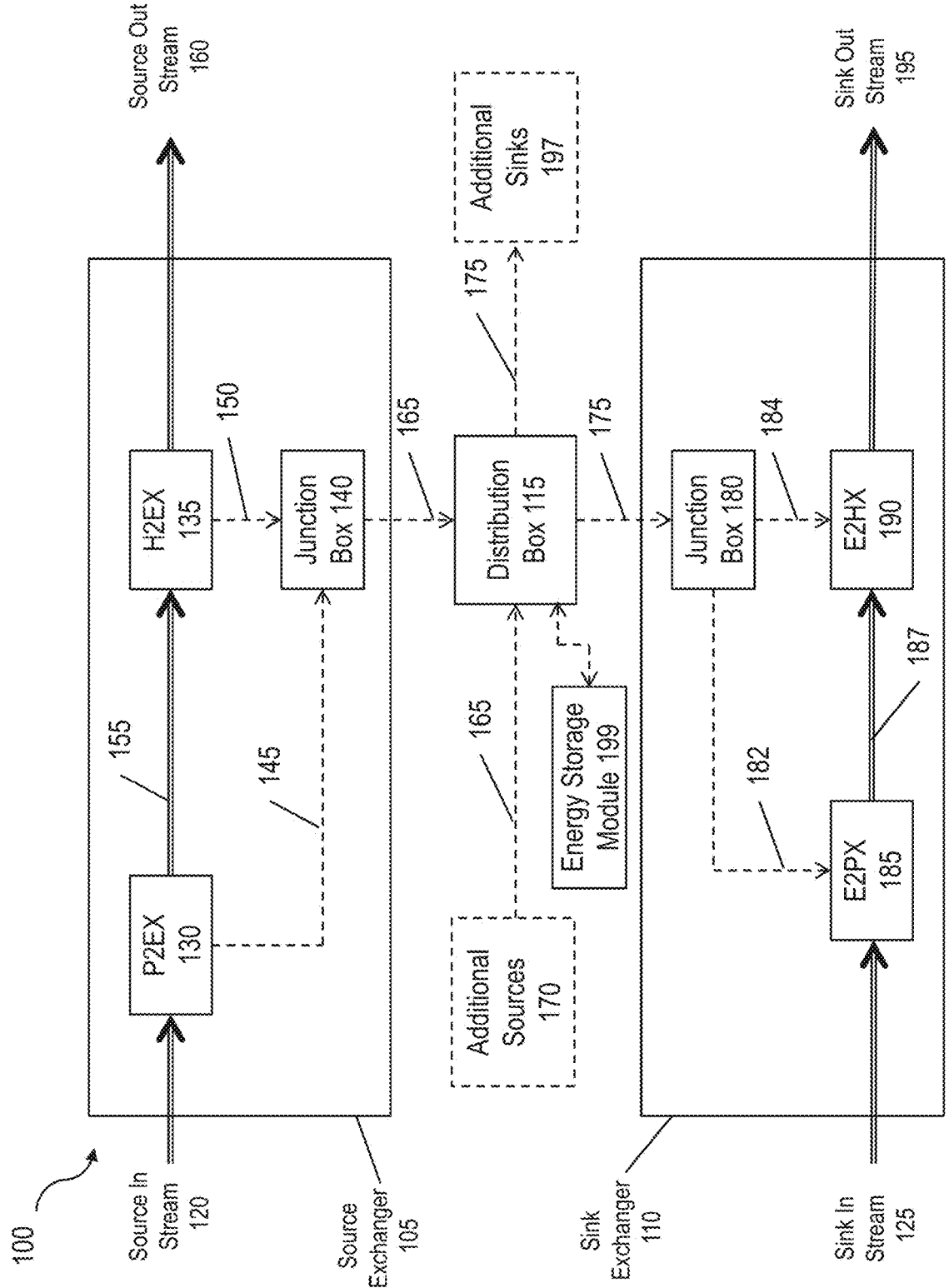
FIG. 1 is system block diagram of a hybrid heat and pressure exchanger system that can transfer heat and pressure by converting heat and pressure to electrical energy, then converting the electrical energy into heat and pressure.

FIG. 1 is system block diagram of a hybrid heat and pressure exchanger (PHX) system 100 that can transfer heat and pressure by converting heat and pressure to electrical energy, then converting the electrical energy into heat and pressure. The PHX system 100 includes a source exchanger 105, a sink exchanger 110, and a distribution box 115. The source exchanger 105 can convert pressure and temperature from a source stream 120 to electrical energy. The sink exchanger 110 can convert electrical energy into pressure and temperature, which can be imparted into sink stream 125. The distribution box 115 can direct the electrical energy from the source exchanger 105 to the sink exchanger 110 and, in some implementations, control operations of each of the source exchanger 105 and sink exchanger 110.

Source exchanger 105 includes a pressure to electrical exchanger (P2EX) 130, heat to electrical exchanger (H2EX) 135, and junction box 140 connected to P2EX 130 and H2EX 135 via pressure electrical line 145 and heat electrical line 150, respectively. P2EX 130 receives the source in stream 120 and converts energy in the form of pressure into electrical energy. P2EX 130 can produce intermediate stream having a pressure, which is lower in pressure than the source in stream 120. P2EX 130 can include a turbine and/or hydroelectric generator, for example, as illustrated in FIGS. 2A and 2B.

Figure 2A:
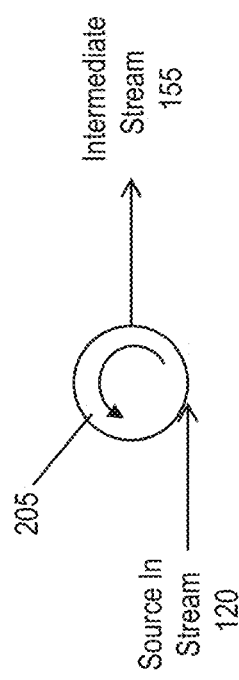
FIG. 2A is an illustration of an example pressure to electrical exchanger.
Figure 2B:
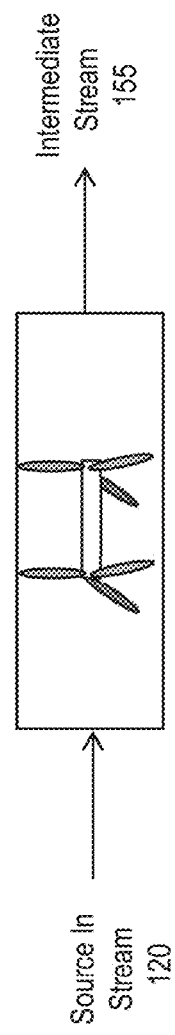
FIG. 2B is a cross sectional view of a generator having propellers configured in a axial flow configuration.

FIG. 2A is an illustration of an example P2EX 130, which can comprise a cyclone 205 that spins propellers to produce electrical energy in a radial flow configuration, and FIG. 2B is a cross sectional view of a generator having propellers configured in a axial flow configuration. The electrical energy converted by P2EX 130 can be characterized by:

$$P_{th} = \frac{\Delta Pm}{1000(SG)}$$

Where $P_{th}$ is the energy of source in stream 120 in kilowatts, $\Delta P$ is the change in pressure between the source in stream 120 and the intermediate stream 155, m is the mass-flow rate in kilograms per second, and SG is the specific gravity of the stream. The efficiency of conversion can be characterized by:

$$\eta = \frac{P_{Break}}{P_{th}}$$

Where $\eta$ is efficiency and $P_{Break}$ is work performed. Efficiencies achieved can be between 85% and 95% in some implementations.

Referring again to FIG. 1, H2EX 135 receives the intermediate stream 155 and converts thermal energy to electrical energy. H2EX 135 can produce a source out stream 160, which may be used in other processes as desired, and has a different pressure and temperature than source in stream 120. H2EX 135 can leverage the thermoelectric effect to directly convert temperature differences into electric voltage/current. For example, FIG. 3 is an example implementation of a H2EX 135 that utilizes the thermoelectric effect.

Figure 3:
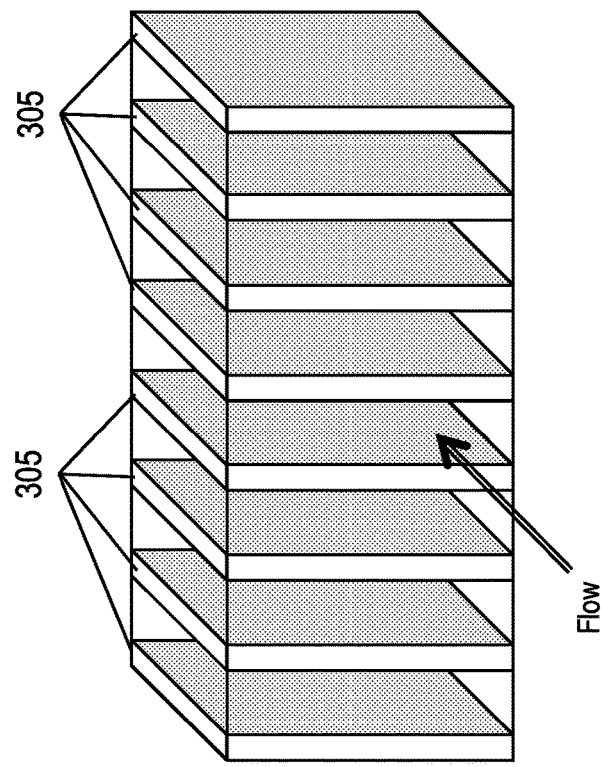
FIG. 3 is an example implementation of a heat to electrical exchanger that utilizes the thermoelectric effect.

FIG. 3 is a cross-section of an example H2EX 135 taking the shape of a box with multiple thermoelectric cooling (TEC) plates 305. The plates are arrange parallel to stream flow so that fluid flows past each plate, which raises the temperature on the plate surface thereby creating a temperature differential and generating electrical energy. The plates can be easily removable for cleaning and replacement or repair. The dimensions of the plates, the number of plates, and their arrangement can vary based on the application.

Figure 4:
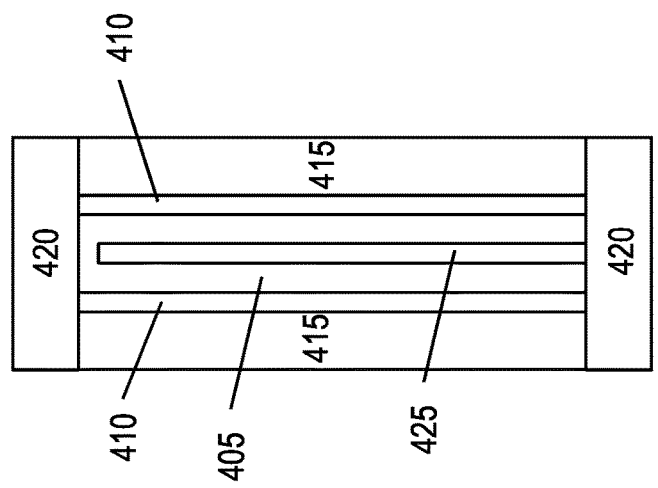
FIG. 4 is a cross section of an example implementation of a thermoelectric cooling plate.

FIG. 4 is a cross section of an example implementation of a TEC plate 305. The TEC plates 305 include a TEC layer 405 between two gasket layers 410, which are between two heat transfer layers 415. Junction layers 420 can form the top and bottom of the plate, which can be formed of the same material as TEC layer 405. The TEC layer 405 may be adhered to the two gasket layers 410, which may be adhered to the two heat transfer layers 415. The TEC layer 405 can include n-type and one p-type elements placed thermally in parallel to each other and electrically in series. An example TEC layer 405 material can include Bismuth Telluride ($Bi_2Te_3$), although other materials are possible such as materials allowing for thermionic transmission based on the Edison effect. The gasket layers 410 serve to separate TEC layer 405 and heat transfer layers 415. In some implementations, the gasket layers 410 may also include TEC materials. The heat transfer layers 415 can include a thermally conductive material, such as aluminum, to improve heat transfer. When the TEC plate 305 is in the H2EX 135, high temperature (e.g., hot) fluid flows on either side of the transfer layers 415, which causes a temperature differential, which causes charge carriers in the material n-type and p-type materials to diffuse from the hot side (e.g., the transfer layers 415, to the cold side (e.g., junction layer 420). These charge carriers produce electrical current (or voltage).

An example suitable TEC layer 405 is available from Hebi I.T. Co. Ltd., Shanghai, China, unit no. TEC1-12730.

The voltage generated when the temperatures of transfer layers 415 and junction layer 420 are different can be characterized by:

$$V_i = k_T(T - T_{REF}), \quad V_{TOTAL} = \sum V_i$$

$$Z = \frac{s^2}{\rho_k},$$

$$EMF = -s\nabla T, \rho = \frac{1}{\sigma}$$

Where Z is figure of merit (effectiveness of the thermoelectric material); i is the plate number where there are multiple plates in the H2EX 135, s is Seebeck coefficient, $k_T$ is thermal conductivity, $\rho_k$ is electrical resistivity, V is voltage, and $T_{REF}$ is temperature reference.

In some implementations, a piezoelectric layer 425 may be included in the TEC plate 305. The piezoelectric layer 425 may reside within (e.g., surrounded on at least two sides by the TEC layer 405 and may serve to convert changes in pressure to electrical energy. For example, piezoelectric layer 425 can include piezoelectric ceramics that, when mechanically activated with pressure or vibration, have capacity to generate electric voltages. The piezoelectric layer 425 can include multiple layers of piezoelectric ceramics alternated with electrodes. The piezoelectric layer 425 can serve as another electric current source that transfers energy from pressure to electrical form. A TEC plate 305 having a piezoelectric layer 425 can supply more electrical energy.

Figure 5:
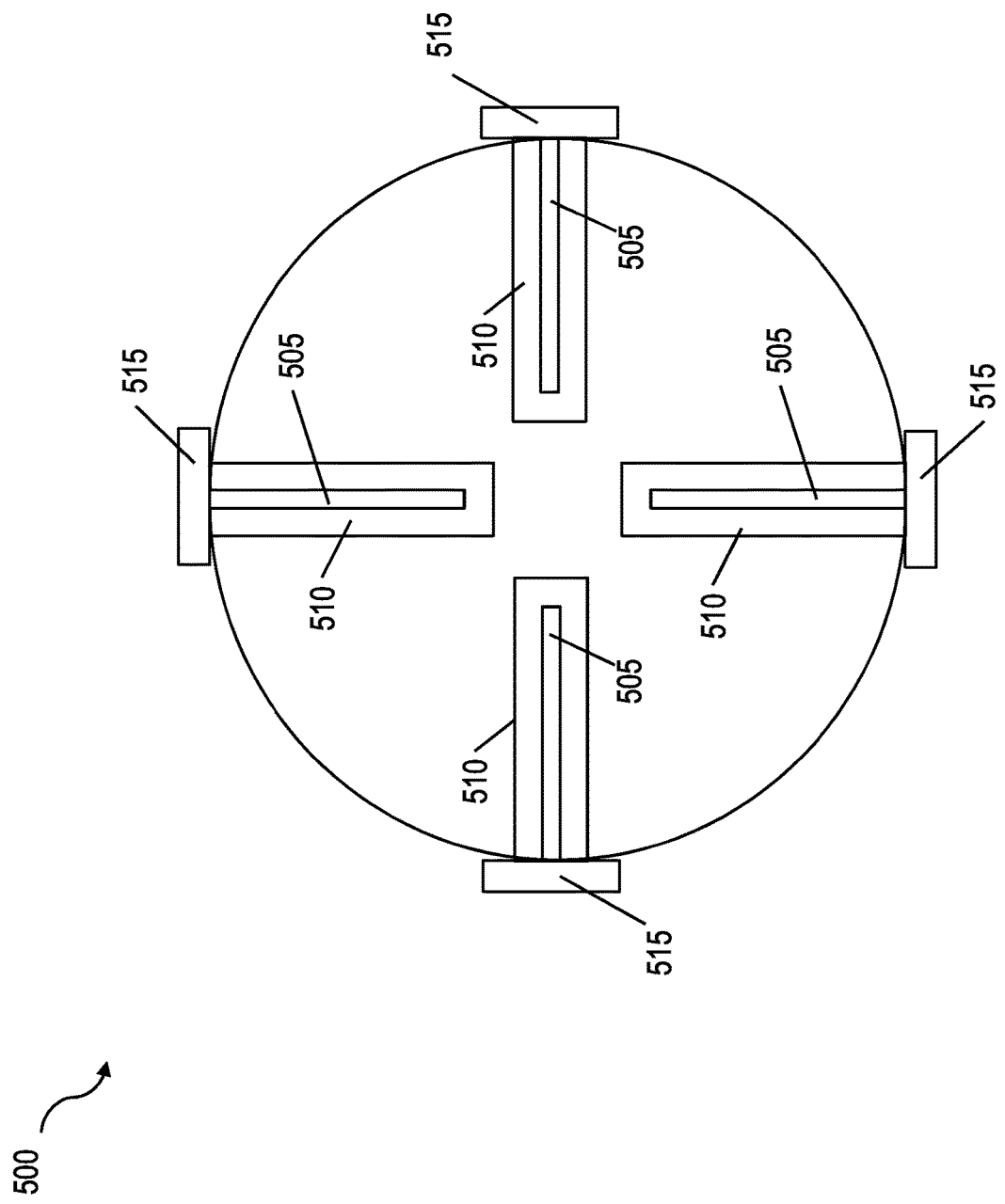
FIG. 5 is cross sectional view of an alternative implementation of a heat to electrical exchanger.

FIG. 5 is a cross sectional view of an alternative implementation of H2EX 135 taking the shape of a pipe with multiple TEC plates 500 extending from the pipe wall towards the center of the pipe. Each TEC plate 500 has a TEC layer 505 surrounded by a transfer layer 510 and junction layer 515.

Referring again to FIG. 1, as the source stream 120 flows through the source exchanger 105, P2EX 130 and H2EX 135 can produce electrical power (e.g., as described above), and junction box 140 can combine the electrical power and provides the combined power to the distribution box 115 via source electrical line 165. In some implementations, distribution box 115 can receive additional electrical power from additional sources 170, which can include one or more additional source exchanger 105 units, although additional sources 170 can include any electrical source.

Distribution box 115 can distribute the received electrical power to sink exchanger 110 via sink electrical line 175. Sink exchanger 110 receives the electrical power at junction box 180, which redirects an appropriate portion of the electrical power to electrical to pressure exchanger (E2PX) 185 and to electrical to heat exchanger (E2HX) 190 using pressure electrical line 182 and heat electrical line 184, respectively. In some implementations, distribution box 115 can distribute the received electrical power to additional sinks 197, which can include one or more additional sink exchanger 110 units.

E2PX 185 uses the electrical energy received from junction box 180 to increase the pressure of sink stream 125. E2PX 185 can include a pump, a motor, and/or turbo generator, which can convert electrical energy to mechanical (e.g., pressure). E2PX 185 may be similar in structure to P2EX 130, although may be configured differently to convert electrical energy to pressure. E2PX 185 produces an intermediate sink stream 187, which has a higher pressure than sink in stream 125.

E2HX 190 uses the electrical energy received from junction box 180 to change the temperature of the intermediate sink stream 187 to produce sink out stream 195. The temperature change may either increase or decrease the temperature of the intermediate sink stream 187. E2HX 190 can include a thermoelectric cooler (also referred to as a thermoelectric heater, heat pump, and the like) and may include similar structure to H2EX 135 (e.g., as described with reference to FIGS. 3-5), although may be configured differently to convert electrical energy to temperature change. In some implementations, and depending on the application, E2HX 190 is the same as H2EX 135 while in other implementations E2HX 190 can include different sized and shaped TEC plates 305, and can include a different number of TEC plates 305, which can be removable or fixed within the E2HX 190 unit.

In some implementations, the PHX system 100 can include one or more energy storage modules 199 to store and/or access energy so that energy may not be transferred immediately (e.g., PHX 100 may store energy for later use and/or resale to a utility grid) or additional energy may be required to change the pressure or heat of the source in or sink in streams (120, 125) than can be exchanged between the streams. Energy storage module 199 can include a battery or other energy storage device. Distribution box 115 may also be connected to a utility grid to supply additional power as needed.

Thus, PHX system 100 takes source in stream 120 and produces source out stream 160 having a different (e.g., lower or higher) pressure and different (e.g., lower or higher) temperature than source in stream 120 while also taking sink in stream 125 and producing sink out stream 195 having a different (e.g., lower or higher) pressure and different (e.g., lower or higher) temperature than sink in stream 125. It is contemplated that the PHX system 100 is not limited to exchanging energy solely using high-pressure high-temperature source streams and low-pressure low-temperature sink streams but can transfer energy between a high-pressure low-temperature source stream and a low-pressure and high-temperature sink stream, vice versus, or any combination of the approaches described herein, such that different types of energy may be transferred between streams according to a given implementation.

Figure 6:
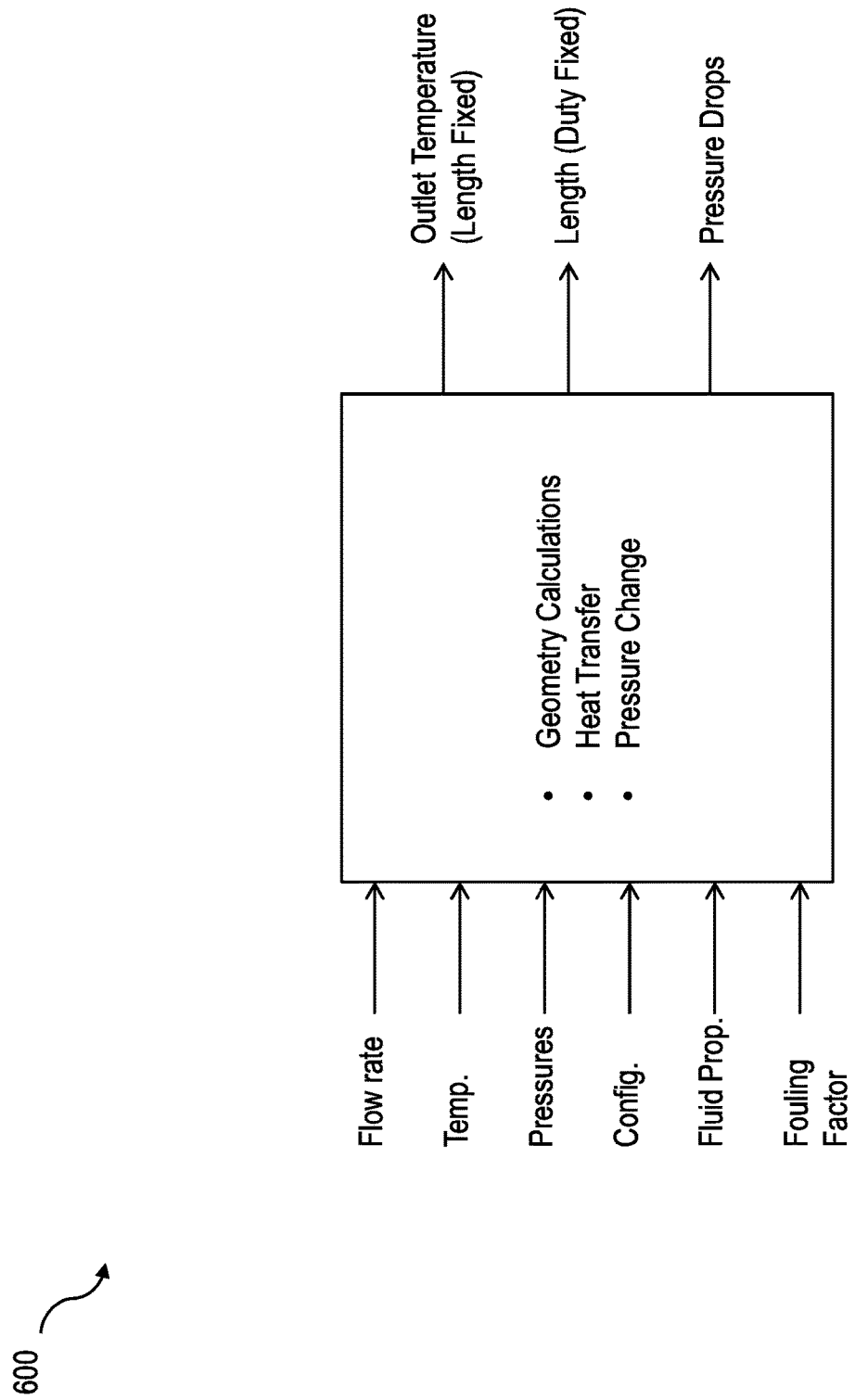
FIG. 6 is a functional block diagram illustrating inputs and outputs to a distribution box for controlling a hybrid pressure and heat exchanger system.

In some implementations, distribution box 115 serves as a system controller. The distribution box 115 can determine capacity and operating parameters of PHX system 100 and can cause or cause to initiate change within source exchanger 105 and/or sink exchanger 110. Distribution box 115 can perform a ratings analysis and determine heat transfer rates and/or pressure changes. For example, FIG. 6 is a functional block diagram 600 illustrating inputs and outputs to a distribution box 115 for controlling PHX system 100. As illustrated in FIG. 6, inputs include stream flow rates, temperatures, pressures, exchanger configurations, fluid properties, and fouling factors. Outputs can include an outlet temperature (length fixed), length (duty fixed), and pressure changes or drops. The various determinations for a plate-type heat exchanger (e.g., for H2EX 135 and/or E2HX 190) can be characterized by:

$$Q = A_0 U_0 \Delta T_{LMTD} \text{ (heat transfer)}$$

$$Q = mC_p\Delta T \text{ (heat load)}$$

$$LMTD = \frac{(T_1 - t_2) - (T_2 - t_1)}{\ln\left(\frac{(T_1 - t_2)}{(T_2 - t_1)}\right)} \text{ (Log Mean Temperature Difference)}$$

$$Re = \frac{d_h \rho V}{\mu}$$

$$d_h = \frac{4A_c}{P_w}$$

$$j = \left(\frac{h}{C_p \rho V}\right)\left(\frac{C_p \mu}{k}\right)^{\frac{2}{3}} \text{ (Colburn factor for comparison)}$$

$$f = \frac{2\Delta p d_h}{4\rho V^2 L} \text{ (friction factor)}$$

$$C_p = \left(\frac{kJ}{\text{Kg} * C}\right)$$

$d_h$ = hyd. diameter (mm)

$\Delta p$ = pressure drop (Pa)

$\mu$ = dynamic viscousity (Pa $*$ s)

$\rho$ = density $\left(\frac{\text{kg}}{\text{m}^3}\right)$ $h$ = coefficient $\left(\frac{w}{\text{m}^2 * C}\right)$ $k$ = conductivity $\left(\frac{w}{\text{m} * C}\right)$ $V$ = velocity $\left(\frac{\text{m}}{\text{s}}\right)$ $P_w$ = wetted parameter (m)

$A_c$ = Cross section area (m$^2$)

$U$ = overall heat transfer coefficient

The distribution box 115 can include one or more intelligent modules, such as machine learning or artificial intelligence algorithms including but not limited to support vector machines, neural networks, Bayesian decision making algorithms, rules engines, and the like. The intelligent modules can adjust components of the PHX system 100, such as rate of flow of the source in stream 120 and sink in stream 125, as well as how much energy to exchange between the streams. In some implementations, the intelligent modules can determine whether to store or access energy from the energy storage module 199. The intelligent modules can receive data from one or more sensors characterizing conditions related to the environment of the PHX system 100, for example, the industrial environment, and make appropriate adjustments to the PHX system 100.

Distribution box 115 may also serve to determine system pinch point. For example, pinch analysis is a methodology for minimizing energy consumption of chemical processes by calculating thermodynamically feasible energy targets (or minimum energy consumption) and achieving them by optimizing heat recovery systems, energy supply methods and process operating conditions. A set of streams can be represented as a function of heat load against temperature. This data can be combined for all the streams in a given facility or plant to characterize all high-temperature streams and all low-temperature streams. The point of closest approach is the pinch point with a hot stream pinch temperature and a cold stream pinch temperature.

Distribution box 115 may also be controlled remotely, for example, using a data network, such as in the case where pinch analysis is performed by another control module.

As used herein, "high-pressure" and "low-pressure" stream implies that the high-pressure stream pressure is greater than the low-pressure stream although the current subject matter may not be limited by relative values, instead, "high-pressure" can be considered as a stream that will have a reduction in pressure energy (e.g., releases pressure energy) and "low-pressure" can be considered as a stream that will have an increase in pressure energy (e.g., requiring pressure energy). The current subject matter is not limited to specific pressure values, unless indicated otherwise. In addition, "high-temperature" and "low-temperature" implies that the high-temperature stream has a temperature that is greater than the low-temperature stream although the current subject matter may not be limited by relative values, instead "high-temperature" can be considered as a stream that will have a reduction in thermal energy (e.g., releases heat) and "low-temperature" can be considered as a stream that will have an increase in thermal energy (e.g., requires heat). The current subject matter is not limited to specific temperature values, unless indicated otherwise.

In some implementations, the PHX 100 can be operated continuously such that energy is transferred continuously or the PHX 100 can be operated discretely such that energy is transferred only during discrete periods.

In some implementations, the PHX 100 does not directly transfer energy between streams, for example, a temperature-to-temperature transfer or a pressure-to-pressure transfer, without converting to electrical energy as an intermediate form of energy.

Figure 7:
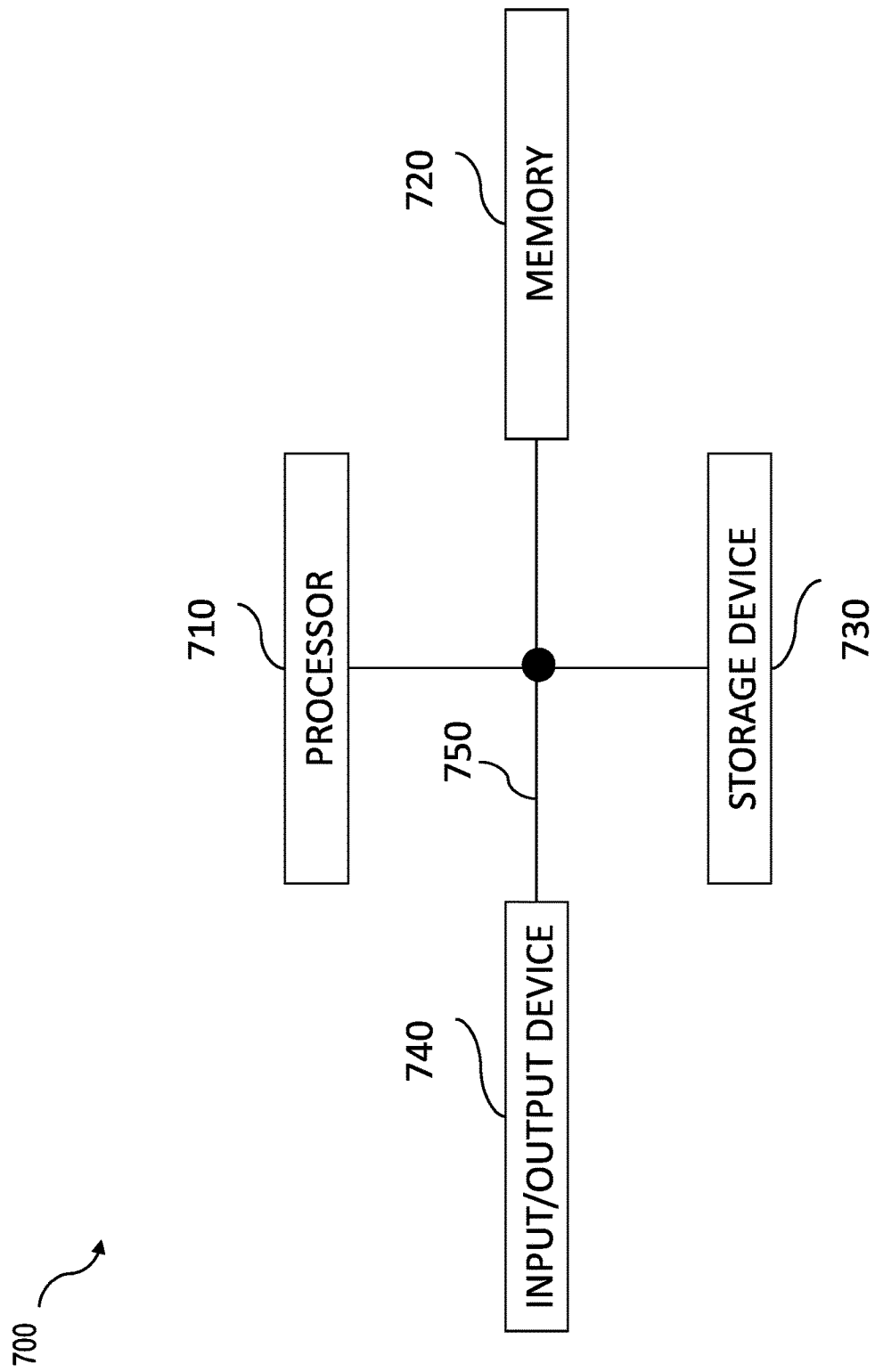
FIG. 7 is a block diagram illustrating an example computing system according to the current subject matter.

Some implementations of the current subject matter include a simulator for computing heat transfer rates consistent with the above-expressions. The transfer is by PHX system 100 for use in configuring a facility with a PHX system 100. In some implementations, the simulator can be configured to be implemented in a system 700, as shown in FIG. 7. The system 700 can include one or more of a processor 710, a memory 720, a storage device 730, and an input/output device 740. Each of the components 710, 720, 730 and 740 can be interconnected using a system bus 750. The processor 710 can be configured to process instructions for execution within the system 700. In some implementations, the processor 710 can be a single-threaded processor. In alternate implementations, the processor 710 can be a multi-threaded processor. The processor 710 can be further configured to process instructions stored in the memory 720 or on the storage device 730, including receiving or sending information through the input/output device 740. The memory 720 can store information within the system 700. In some implementations, the memory 720 can be a computer-readable medium. In alternate implementations, the memory 720 can be a volatile memory unit. In yet some implementations, the memory 720 can be a non-volatile memory unit. The storage device 730 can be capable of providing mass storage for the system 700. In some implementations, the storage device 730 can be a computer-readable medium. In alternate implementations, the storage device 730 can be a floppy disk device, a hard disk device, an optical disk device, a tape device, non-volatile solid state memory, or any other type of storage device. The input/output device 740 can be configured to provide input/output operations for the system 700. In some implementations, the input/output device 740 can include a keyboard and/or pointing device. In alternate implementations, the input/output device 740 can include a display unit for displaying graphical user interfaces.

Although a few variations have been described in detail above, other modifications or additions are possible. For example, TEC plate sizes (height, width, length of its various layers), geometries, types (e.g., parallel plate, shell-in-tube, and the like), and configurations can vary. PHX systems 100 can be used in a variety of industrial processes for recycling energy.

Example Pressure Exchanger

The current subject matter can include an exchanger for transferring or exchanging energy from a pressurized fluid stream to another lower pressure fluid stream, or to electricity, or to both. The current subject matter can be compact, inexpensive, and can be applied to recycle energy in many applications involving pressurized fluid streams.

Figure 8:
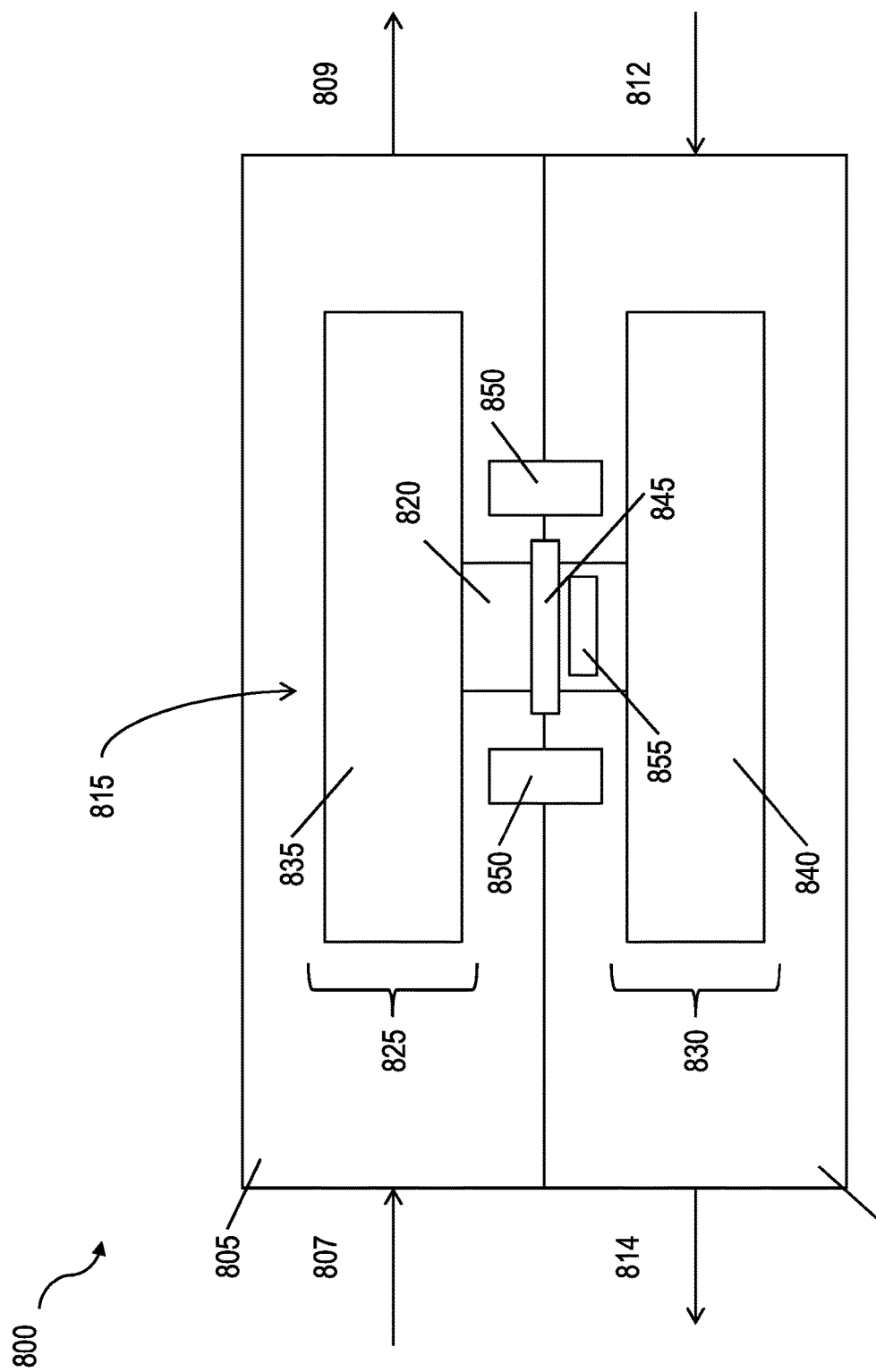
FIG. 8 is a cross sectional view of an example exchanger.

FIG. 8 is a cross sectional view of an example exchanger 800 according to the current subject matter. The exchanger 800 includes high-pressure channel 805 and adjacent low-pressure channel 810, each of which can include pipes formed of a suitable material, such as industrial grade steel. The high-pressure channel 805 includes inlet 807 and outlet 809. The low-pressure channel 810 includes inlet 802 and outlet 814.

Figure 9:
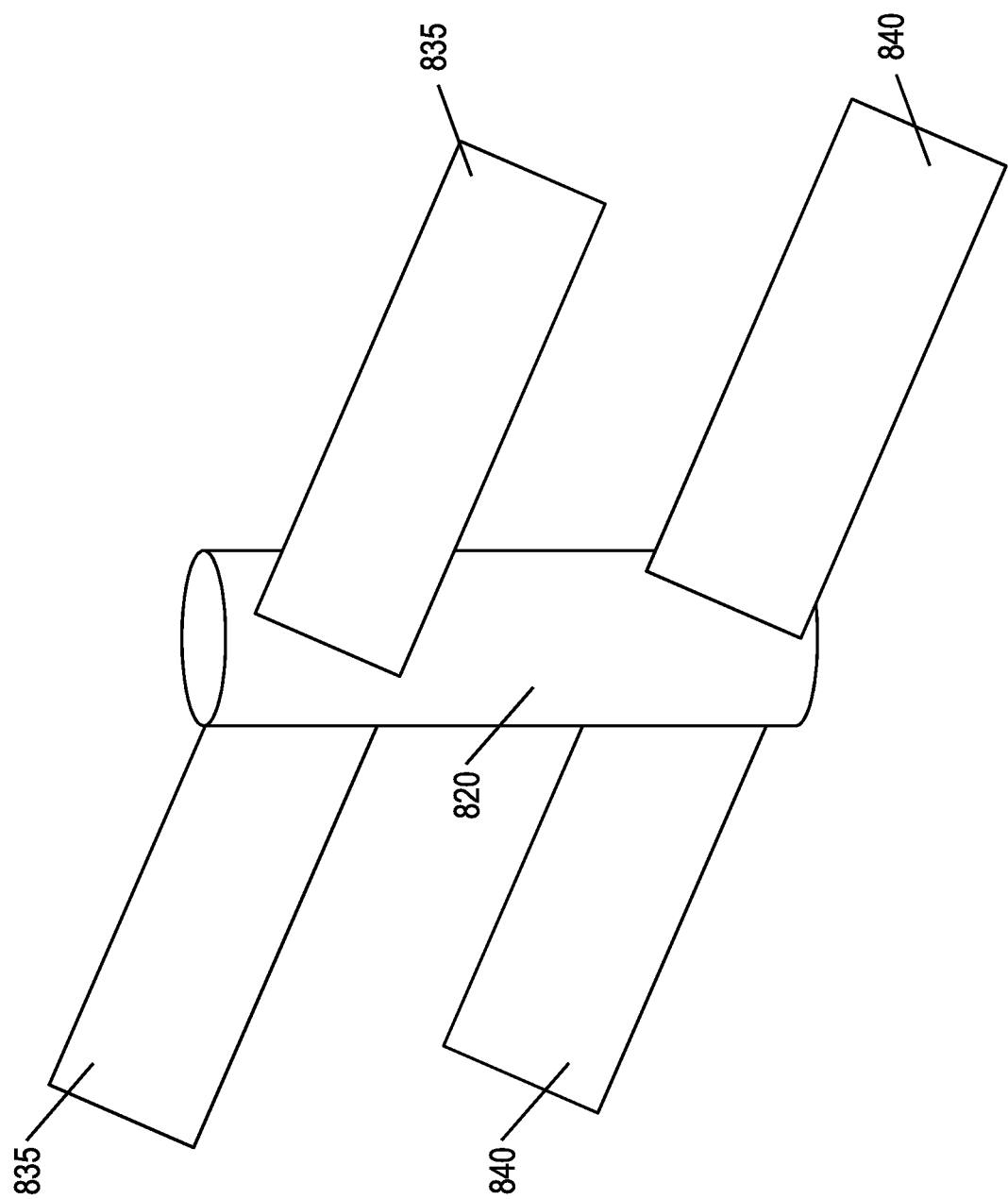
FIG. 9 is a perspective view of an example transfer turbine.

Exchanger 800 includes transfer turbine 815 having shaft 820 or rotor assembly connecting first portion 825 and second portion 830. FIG. 9 is a perspective view of an example implementation of transfer turbine 815. The first portion 825 includes blades 835, such as a propeller or bucket, connected to shaft 820 and residing within the high-pressure channel 805. The second portion 830 includes blades 840, such as a propeller or bucket, connected to shaft 820 and residing within the low-pressure channel 810. A seal 845 can reside between the high-pressure channel 805 and low-pressure channel 810 isolating the high-pressure channel 805 and the low-pressure channel 810 to prevent mixing of fluid in the high-pressure channel 805 and fluid in the low-pressure channel 810. The transfer turbine 815 can be configured for radial flow or axial flow. The fluids flowing through the exchanger 800 can include liquid, gas, and/or a slurry or mixture of liquid, gas, and/or solids. The transfer turbine 815 can be impulse or mixed.

Exchanger 800 can also include an electrical generator stator 850 formed into walls between high-pressure channel 805 and low-pressure channel 810. A corresponding electric generator rotor 855 can be included on the shaft 820 of the transfer turbine 815.

In operation, a high-pressure stream of fluid can flow through the high-pressure channel 805, which imparts a force on the blades 835 of the first portion 825, rotating the blades 835. This, in turn, causes the shaft 820 to rotate, which causes the blades 840 of the second portion 830 to rotate synchronized with rotation of the first portion 825. The second portion 830 can rotate to increase a pressure of a low-pressure fluid flowing through low-pressure channel 810. Thus, mechanical energy in the form of pressure from a high-pressure fluid stream flowing through the high-pressure channel 805 can be transferred to a low-pressure fluid stream flowing through the low-pressure channel 810.

In addition to pressure-to-pressure exchange, exchanger 800 can transfer mechanical energy in the form of pressure to electrical energy in a pressure-to-electrical exchange. The high-pressure stream of fluid can flow through high-pressure channel 805, which imports force on blades 835 and causes shaft 820 to rotate. Electrical generator rotor 855 rotates with shaft 820 and, in combination with electrical generator stator 850, can generate electrical energy.

In some implementations, the electrical generator stator 850 can be driven by an electrical input as a motor, which causes the shaft 820 and associated first portion 825 and second portion 830 to rotate. Thus, the current subject matter can serve as a pump in some applications.

Figure 10:
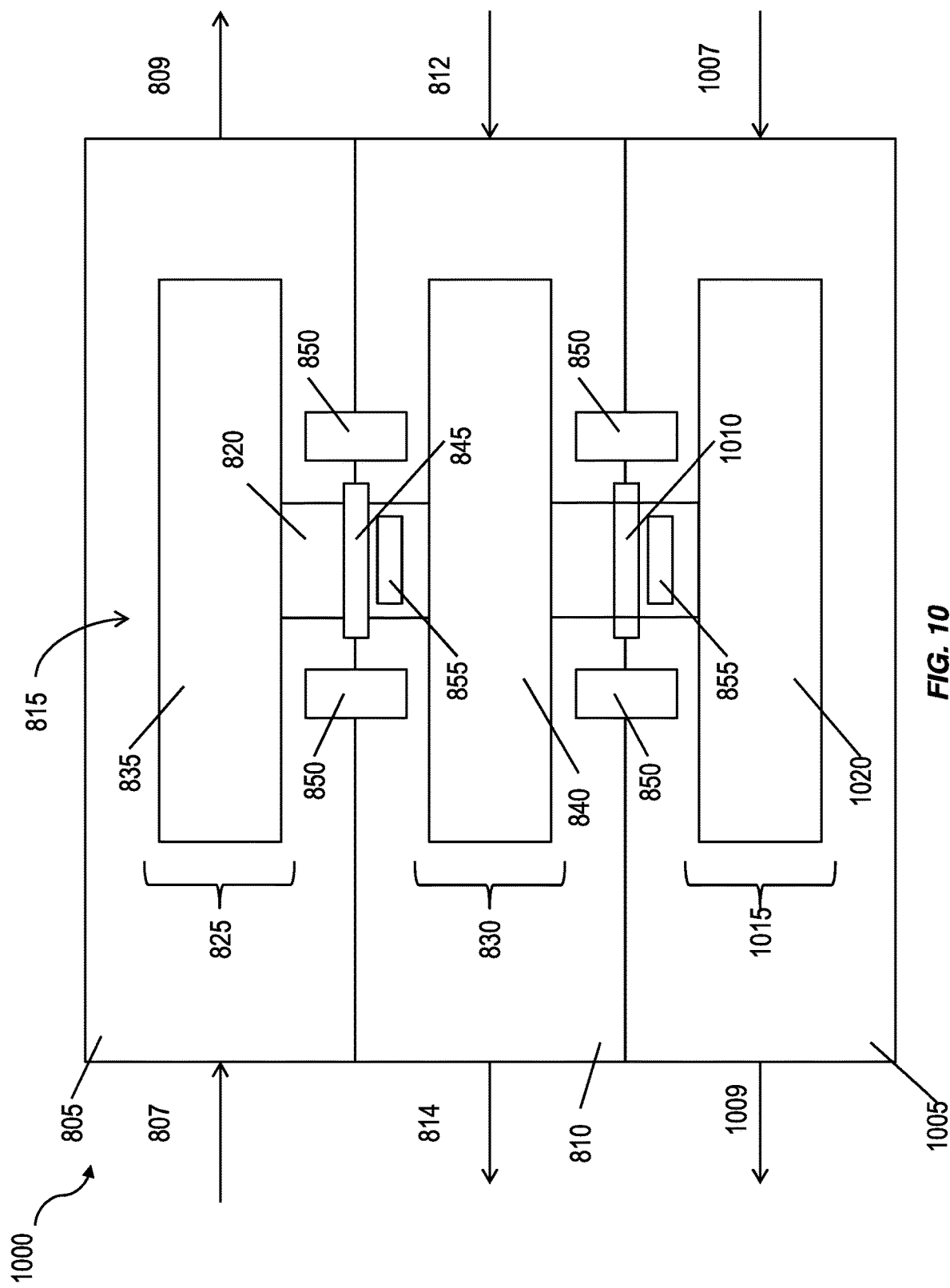
FIG. 10 is a cross sectional view of an example exchanger for transferring energy from one stream to many streams.

FIG. 10 is an example implementation of an exchanger 1000 transferring energy from one stream to many streams. The exchanger 1000 includes a high-pressure channel 805, a low-pressure channel 810, and a second low-pressure channel 1005. The second low-pressure channel includes an inlet 1007 and an outlet 1009. A second seal 1010 can reside between the first low-pressure channel 810 and the second low-pressure channel 1005 isolating the low-pressure channel 810 and the second low-pressure channel 1005 to prevent mixing of fluid in the low-pressure channel 810 and fluid in the second low-pressure channel 1005.

The shaft 820 can extend into the second low-pressure channel 1005 through the second seal 1010 and can include a third portion 1015 with blades 1020. Rotation of any of the portions (e.g., first portion 825, second portion 830, and third portion 1015) results in rotation of the shaft 820, which synchronizes rotation of all of the portions (e.g., first portion 825, second portion 830, and third portion 1015) and their corresponding blades.

In operation, force exerted on the blades 835 of the first portion 825 of the transfer turbine 815 by a high-pressure stream entering the first channel inlet 807 and exiting the first channel outlet 809 causes rotation of the blades 840 of the second portion 830 of the transfer turbine 815, which transfers pressure from the high-pressure stream to a first low-pressure stream entering the second channel inlet 812 and exiting the second channel outlet 814. Pressure is also transferred from the high-pressure stream to a second low-pressure stream entering the third channel inlet 1007 and exiting the third channel outlet 1009. In some implementations, the current subject matter can also include a many-to-many exchange (e.g., multiple high-pressure channels and multiple low-pressure channels) and a many-to-one exchange (e.g., multiple high-pressure channels and one low-pressure channel).

Figure 11:
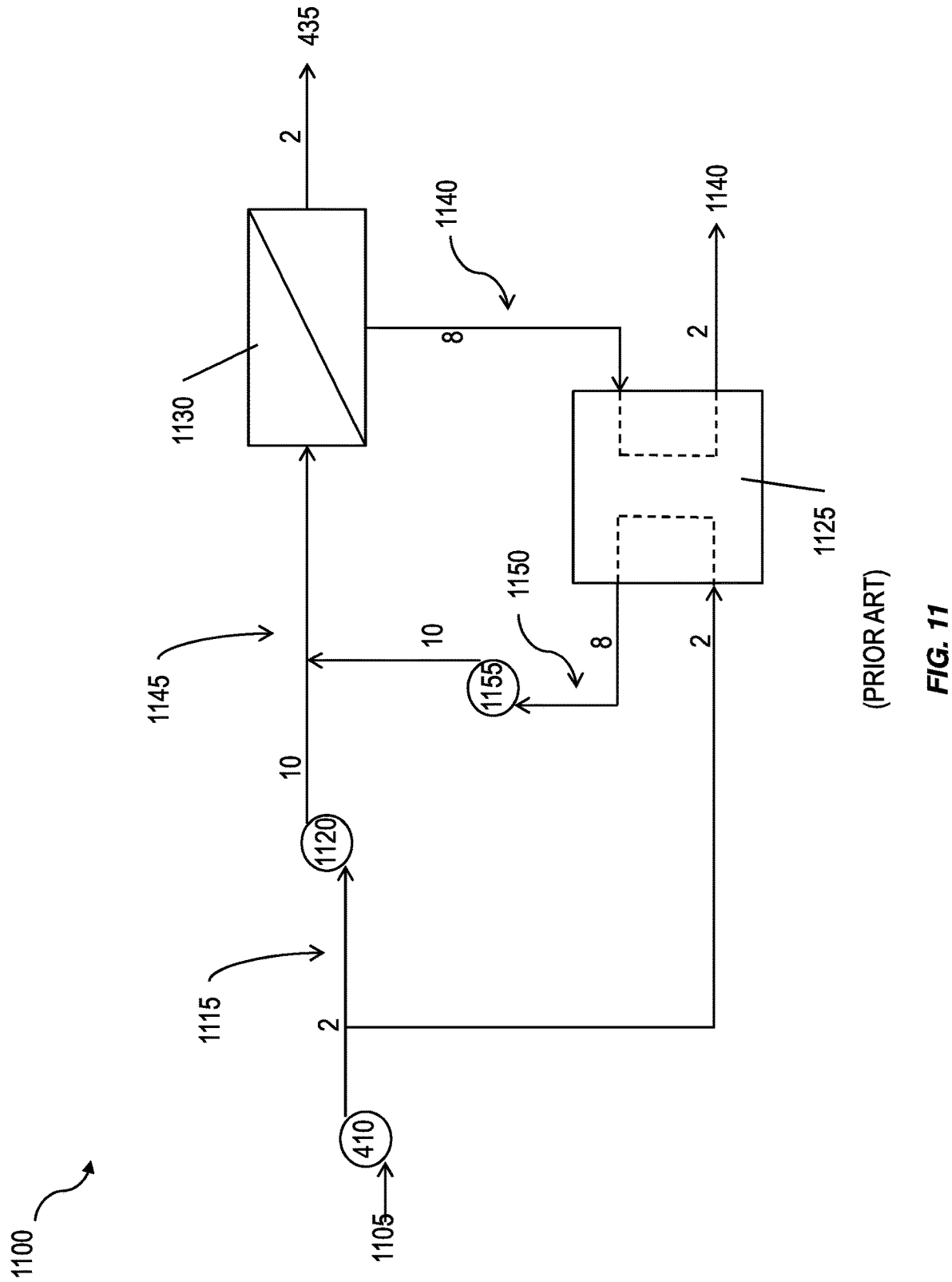
FIG. 11 is a system block diagram illustrating a desalinization processing plant.

One example application for an exchanger 800 can include a desalinization processing plant using reverse osmosis. Reverse osmosis is performed using very high fluid pressures. FIG. 11 is a system block diagram illustrating a known implementation of a desalinization processing plant 1100. An input stream 1105, usually seawater, is brought into the plant and fed into a first pump 1110, which raises the input stream 1105 pressure to create an intermediate-pressure stream 1115 (illustrated in FIG. 11 as having a 2-unit pressure). The intermediate-pressure stream 1115 splits, a portion of which feeds into a second pump 1120 and a portion feeds into pressure exchanger 1125. The second pump 1120 creates high-pressure stream 1145 (illustrated as having a 10-unit pressure) for input into reverse osmosis plant 1130, which desalinates the high-pressure stream creating output stream 1135 of potable water and waste stream 1140 having high concentrations of salt. Waste stream 1140 is still at a relatively high pressure (illustrated as having an 8-unit pressure) and feeds into pressure exchanger 1125, which transfers pressure from waste stream 1140 to intermediate-pressure stream 1115 to create a second intermediate-pressure stream 1150 (illustrated as having an 8-unit pressure) thereby recycling the pressure of the waste stream 1140.

A third pump 1155 increases the pressure of the second intermediate stream 1150 and outputs the stream to the high-pressure stream 1145. But in order to have sufficient throughput, the desalinization system of FIG. 11 requires many pressure exchangers 1125 operating in parallel, which in turn requires dedicated piping, which increases costs and reduces efficiencies because the greater piping length used by a system, the greater energy required by system pumps to appropriately pressurize the system.

Figure 12:
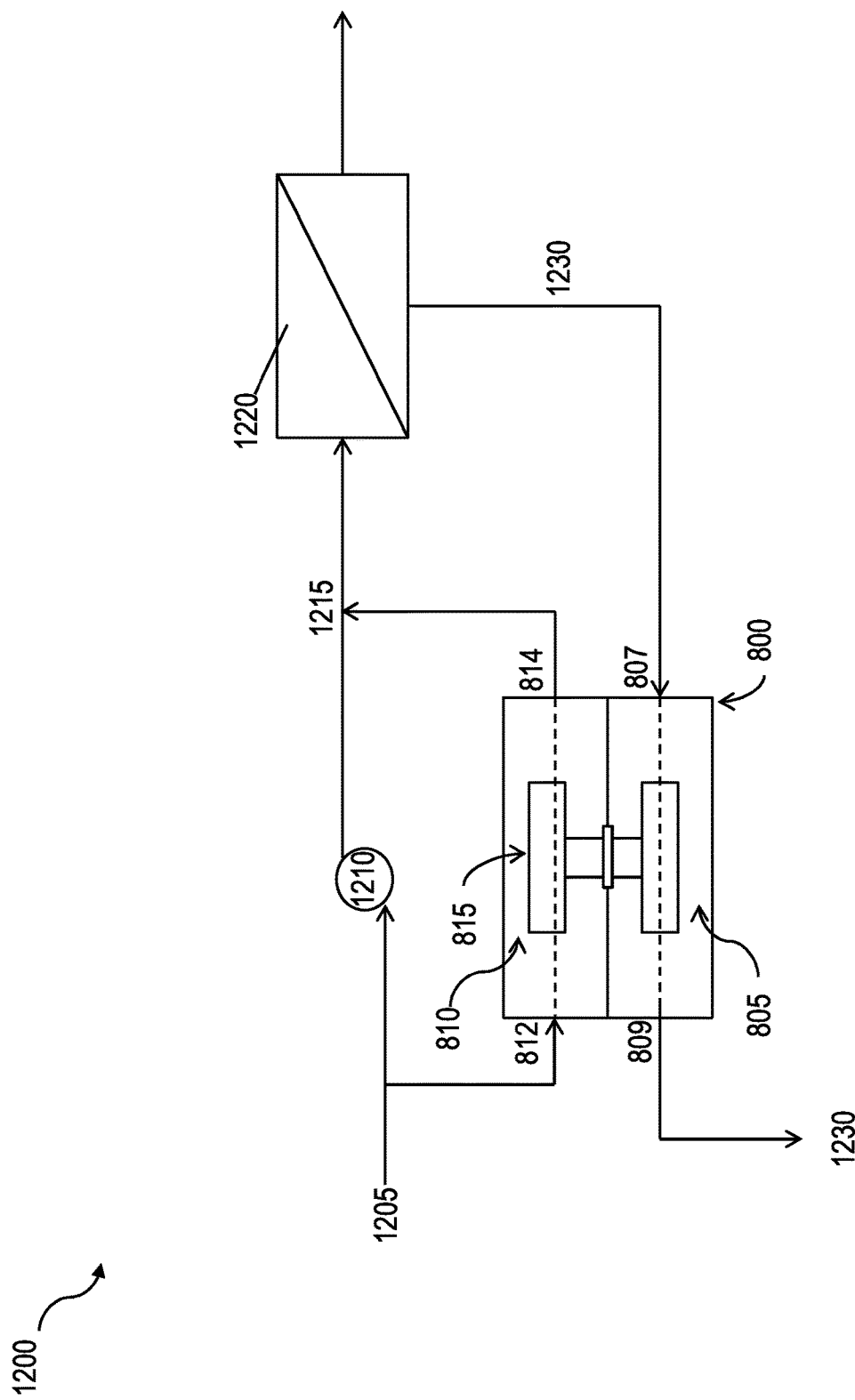
FIG. 12 is a system block diagram illustrating an example desalinization system using an exchanger.

FIG. 12 is a system block diagram illustrating an example implementation of a desalinization system 1200 using an exchanger 800, for example, as described in FIG. 8. The desalinization system 1200 may require fewer pumps, pipes, and exchangers than the system illustrated in FIG. 11 and therefore is more efficient and cost effective. Additionally, the input stream 1205 of water having high salt content, such as seawater, inputs in parallel to a pump 1210 and to exchanger 800. Specifically, the input stream 1205 feeds to inlet 812 of low-pressure channel 810.

Pump 1210 outputs a high-pressure stream 1215, which feeds into reverse osmosis plant 1220, which desalinates the high-pressure stream creating output stream 1225 of potable water and waste stream 1230 having high concentrations of salt. Waste stream 1230 is still at a relatively high pressure and feeds into exchanger 800. Specifically, waste stream 1230 feeds into inlet 807 of the high-pressure channel 805. Waste stream 1230 causes rotation of the transfer turbine 815, which transfers pressure from waste stream 1230 to input stream 1205 to create the high-pressure stream 1215. High-pressure stream 1215 feeds out of outlet 814 of the low-pressure channel 810 and combines with the output of pump 1210 thereby recycling the pressure of the waste stream 1230. The waste stream 1230 feeds out of outlet 809 of high-pressure channel 805 and can be discarded.

Figure 13:
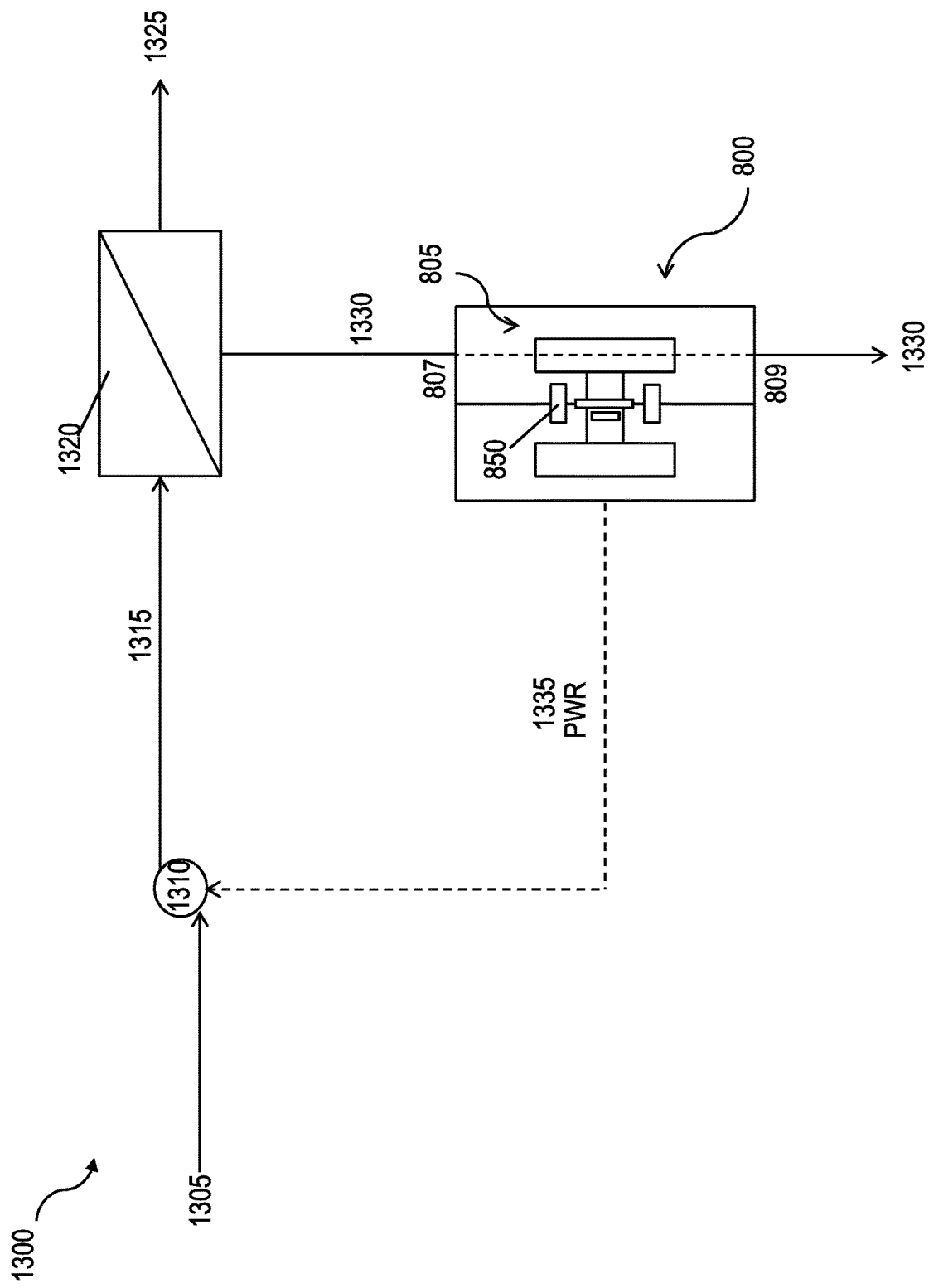
FIG. 13 is a system block diagram illustrating another example desalinization processing plant in which an exchanger is used to recycle energy in electrical form for reuse in the plant.

FIG. 13 is a system block diagram illustrating another example desalinization processing plant 1300 configuration in which exchanger 800 is used to recycle energy in electrical form for reuse in the plant 1300. The desalinization processing plant 1300 may require fewer pumps, pipes, and exchangers than the system illustrated in FIG. 11 and therefore is more efficient and cost effective.

Input stream 1305 of water having high salt content, such as seawater, inputs to a pump 1310. Pump 1310 outputs a high-pressure stream 1315, which feeds into reverse osmosis plant 1320, which desalinates the high-pressure stream creating output stream 1325 of potable water and waste stream 1330 having high concentrations of salt. Waste stream 1330 is still at a relatively high pressure and feeds into exchanger 800. Specifically, waste stream 1230 feeds into inlet 807 of the high-pressure channel 805. Waste stream 1230 causes rotation of the transfer turbine 815, which causes the electric generator rotor 855 to rotate.

Exchanger 800 can generate electrical energy or power through interaction of the rotating electric generator rotor 855 and stator 850. The exchanger 800 can produce electrical power, 1335, which can feed into pump 1310 in order to operate pump 1310 thereby recycling the energy from the high-pressure waste stream 1330. In some implementations, the power 1335 can be used for other purposes, such as feeding back into a utility grid for remote consumption. Waste stream 1330 feeds out of outlet 809 of high-pressure channel 805 and can be discarded.

The current subject matter can be used in many different applications in part because some implementations of the exchanger 800 can be compact and inexpensive. Thus, some applications previously too expensive to be practical are possible with the current subject matter. For example, FIG. 14 is a system block diagram illustrating an exchanger 800 operating to recycle energy in an office building 1400. Office building 1400 may be hundreds of feet tall (if not taller). In order to provide water for facilities such as restrooms and kitchens, a pump 1410 must pump an input stream 1405 to a given floor for consumption. Some office buildings have reservoirs 1415 near the top of the building 1400 that supply water to the entire building. Energy from wastewater stream 1420 exiting the office building 1400 can be recycled using an exchanger 800. Specifically, input stream 1405 can feed into low-pressure channel 810 and wastewater stream 1420 can feed into high-pressure channel 805. The wastewater stream 1420 can cause rotation of the transfer turbine, which can transfer pressure from the wastewater stream 1420 to the input stream 1405. Such a configuration can save energy and recover some of the energy required to pump water to the top of a building.

The subject matter described herein provides many technical advantages. For example, energy can be recovered and recycled in many processes and environments. The exchanger can be constructed simply, avoiding complex mechanical systems that require constant maintenance and upkeep. One-to-one exchange or one-to-many exchange can be possible, allowing for recovery of energy in both pressure and electric form. The current subject matter can prevent mixing between high-pressure and low-pressure streams, eliminating contamination between input and waste streams. Moreover, by recycling power, energy costs are reduced.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system for exchanging pressure and heat from a source stream to a sink stream, the system comprising:
    a source exchanger comprising:
        a first pressure exchanger converting pressure of the source stream to electrical energy; and
        a first heat exchanger converting temperature from the source stream via a first temperature differential to electrical energy;
    a sink exchanger comprising:
        a second pressure exchanger using electrical energy received from the source exchanger to change a pressure of the sink stream; and
        a second heat exchanger using electrical energy received from the source exchanger to change a temperature of the sink stream.

2. The system of claim 1, the source exchanger further comprising:
    a source junction box combining electrical energy received from the first pressure exchanger with electrical energy received from the first heat exchanger.

3. The system of claim 1, the sink exchanger further comprising:
    a sink junction box distributing a portion of electrical energy to the second pressure exchanger and distributing another portion of electrical energy to the second heat exchanger.

4. The system of claim 1, the first heat exchanger and/or the second heat exchanger comprising:
a plurality of thermoelectric plates.

5. The system of claim 4, each thermoelectric plate comprising:
a thermoelectric layer;
gasket layers adjacent at least two sides of the thermoelectric layer;
heat transfer layers adjacent the gasket layers such that the gasket layers separate the heat transfer layers from the thermoelectric layer; and
one or more junction layers in contact with the thermoelectric layer.

6. The system of claim 5, wherein each thermoelectric plate further comprises a piezoelectric layer surrounded at least in part by the thermoelectric layer.

7. The system of claim 5, wherein the thermoelectric layer and the one or more junction layers are formed of a n-type and/or p-type material.

8. The system of claim 4, wherein the plurality of thermoelectric plates are arranged in a box configuration.

9. The system of claim 4, wherein the plurality of thermoelectric plates are arranged within a pipe and along an axial flow axis of the pipe.

10. The system of claim 1, wherein the source exchanger and sink exchanger are non-proximal.

11. The system of claim 1 further comprising an energy storage module.

* * * * *